（12） United States Patent
Kurono

(10) Patent No.: US 7,733,498 B2
(45) Date of Patent: Jun. 8, 2010

(54) EXPOSURE APPARATUS, METHOD OF CONTROLLING THE SAME, AND MANUFACTURING METHOD

(75) Inventor: Yasutomo Kurono, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 240 days.

(21) Appl. No.: 12/099,216

(22) Filed: Apr. 8, 2008

(65) Prior Publication Data

US 2008/0259347 A1 Oct. 23, 2008

(30) Foreign Application Priority Data

Apr. 20, 2007 (JP) ............................. 2007-112296

(51) Int. Cl.
*G01B 9/02* (2006.01)
(52) U.S. Cl. ..................................... 356/500
(58) Field of Classification Search ................. 356/498, 356/500, 508–510
See application file for complete search history.

(56) References Cited

U.S. PATENT DOCUMENTS 6,897,963 B1 * 5/2005 Taniguchi et al. ........... 356/500

FOREIGN PATENT DOCUMENTS

JP 2005-353969 A 12/2005

* cited by examiner

*Primary Examiner*—Hwa S. A Lee
(74) *Attorney, Agent, or Firm*—Canon U.S.A., Inc., IP Division

(57) ABSTRACT

An exposure apparatus comprises an optical system support supporting a projection optical system, a stage surface plate, first stage and second stages, a first interferometer configured to measure stage position in a first area, a second interferometer configured to measure stage position in a second area, a third interferometer which is interposed between the first interferometer and the second interferometer, a gap sensor configured to measure a gap between the optical system support and the stage surface plate, and a control unit configured to pass, in the swapping, the measurement result obtained by one of the first interferometer and the second interferometer to the other one of the first interferometer and the second interferometer using the measurement result obtained by the third interferometer, and to correct the passed measurement result based on the measurement result obtained by the gap sensor.

5 Claims, 7 Drawing Sheets

EXPOSURE APPARATUS, METHOD OF CONTROLLING THE SAME, AND MANUFACTURING METHOD

BACKGROUND OF THE INVENTION

1. Field of the Invention

The present invention relates to an exposure apparatus used in a semiconductor manufacturing process and, more particularly, to a projection exposure apparatus which projects and transfers an exposure pattern formed on an original plate onto a substrate.

2. Description of the Related Art

Conventionally, an exposure apparatus used in a semiconductor manufacturing process comprises a stage device having a coarse moving stage which rapidly accelerates/decelerates with a high acceleration/deceleration, and a fine moving stage which accurately aligns a substrate. To save the alignment waiting time and to improve the throughput, such an exposure apparatus parallelly executes alignment measurement and exposure by swapping the positions of two stages between an alignment measurement area and an exposure area. This processing is called a swap.

JP2005-353969A discloses a technique of interposing intermediary interferometers between a plurality of interferometers which measure the positions of coarse moving stages. The intermediary interferometer passes the measurement result obtained by one interferometer to the other interferometer before and after a swap, thereby improving the alignment accuracy of a stage device in an exposure station.

Unfortunately, JP2005-353969A does not describe how to measure the distance between an optical system support and a stage surface plate. Even when the stage surface plate deforms or its position changes before and after a swap operation, it is impossible to detect any misalignments of stages due to such factors. As a consequence, the alignment accuracy of the stage device deteriorates after the swap operation, so alignment or the like must be repeatedly performed. This results in prolongation of the processing time per wafer.

SUMMARY OF THE INVENTION

The present invention has been made in consideration of the above-described problem, and has as its object to improve the alignment accuracies of two stages after swapping them.

According to the first aspect of the present invention, there is provided an exposure apparatus comprising an optical system support configured to support a projection optical system, a stage surface plate, a first stage and second stage which can move between a first area and second area on the stage surface plate, a first interferometer configured to measure stage position relative to the stage surface plate in the first area, a second interferometer configured to measure stage position relative to the stage surface plate in the second area, a third interferometer which is interposed between the first interferometer and the second interferometer and configured to measure stage position relative to the stage surface plate and to pass the measurement result obtained by one of the first interferometer and the second interferometer to the other one of the first interferometer and the second interferometer, a gap sensor configured to measure a gap between the optical system support and the stage surface plate, and a control unit configured to pass, when the first stage and the second stage swap by moving between the first area and the second area, the measurement result obtained by one of the first interferometer and the second interferometer to the other one of the first interferometer and the second interferometer using the measurement result obtained by the third interferometer, and to correct the passed measurement result based on the measurement result obtained by the gap sensor.

According to the second aspect of the present invention, there is provided a method of controlling an exposure apparatus which comprises an optical system support configured to support a projection optical system, a stage surface plate, a first stage and second stage which can move between a first area and second area on the stage surface plate, a first interferometer configured to measure stage position relative to the stage surface plate in the first area, a second interferometer configured to measure stage position relative to the stage surface plate in the second area, and a third interferometer which is interposed between the first interferometer and the second interferometer and configured to measure stage position relative to the stage surface plate and to pass the measurement result obtained by one of the first interferometer and the second interferometer to the measurement result obtained by the other one of the first interferometer and the second interferometer, comprising steps of measuring a gap between the optical system support and the stage surface plate, passing, when the first stage and the second stage swap by moving between the first area and the second area, the measurement result obtained by one of the first interferometer and the second interferometer to the measurement result obtained by the other one of the first interferometer and the second interferometer using the measurement result obtained by the third interferometer, and correcting the passed measurement result on the basis of the gap.

According to the third aspect, there is provided a method of manufacturing a device, the method comprising steps of forming a latent image pattern on a substrate using an exposure apparatus as defined above, and developing the latent image pattern formed on the substrate.

According to the present invention, it is possible to improve the alignment accuracies of two stages after swapping them.

Further features of the present invention will become apparent from the following description of exemplary embodiments with reference to the attached drawings.

DESCRIPTION OF THE EMBODIMENT

The present invention can measure the position of a stage surface plate, on which two stages are arranged to be movable, using a gap sensor arranged on an optical system support, and can correct the position of each stage based on the measurement result. An exposure apparatus according to a preferred embodiment of the present invention will be described in detail below with reference to the accompanying drawings.

Figure 1:
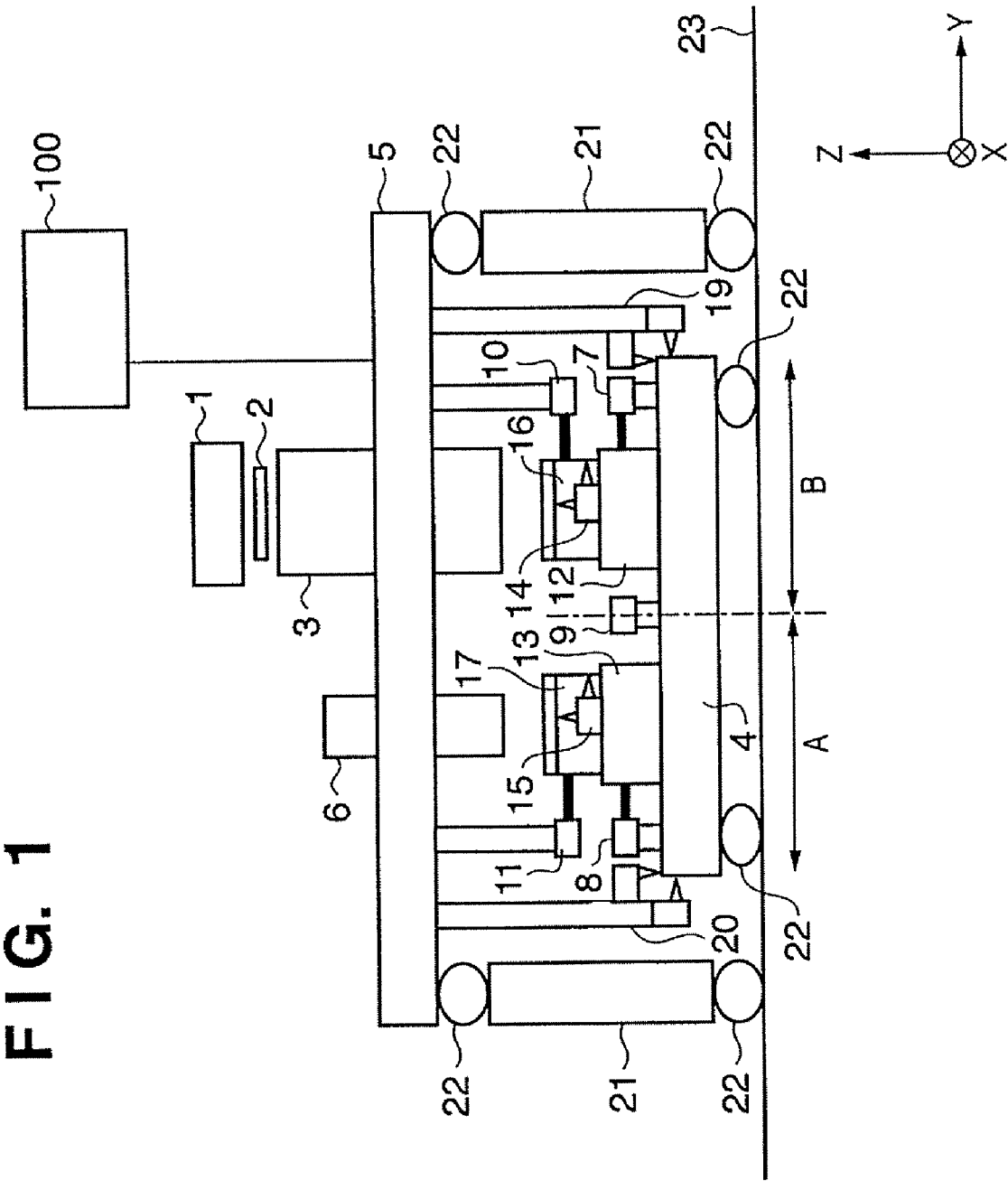
FIG. 1 is a view schematically showing the arrangement of an exposure apparatus according to a preferred embodiment of the present invention.

FIG. 1 is a view schematically showing the arrangement of an exposure apparatus according to a preferred embodiment of the present invention. FIG. 1 shows the arrangement of the exposure apparatus according to this embodiment when seen from the X direction.

An illumination unit 1 shapes exposure light from a light source and irradiates an original plate 2 such as a reticle, on which an exposure pattern is drawn, with the exposure light. An original plate stage (not shown) holds the original plate 2 and scans the original plate 2 relative to a substrate (not shown) at the reduction exposure magnification ratio of a reduction exposure system 3 serving as a projection optical system. The reduction exposure system 3 such as a reduction projection lens reduces the exposure pattern formed on the original plate 2, and projects it onto the substrate. A stage surface plate 4 sequentially aligns a substrate relative to the exposure position of the reduction exposure system 3 for every exposure. A photosensitive agent such as a photoresist is applied on the substrate to project and transfer the exposure pattern drawn on the original plate 2 onto the substrate via the reduction exposure system 3.

The stage surface plate 4 supports and guides a substrate stage in two areas, i.e., an alignment measurement area A serving as a first area and an exposure area B serving as a second area (both of which are to be described later). A damper 22 is inserted between the stage surface plate 4 and a base surface plate 23. The damper 22 damps any disturbance from the base surface plate 23 before it reaches the stage surface plate 4. An optical system support 5 supports, e.g., the reduction exposure system 3 and fine movement interferometers 10 and 11 and gap sensors 19 and 20 (both of which are to be described later). The optical system support 5 is supported by the base surface plate 23 installed on the floor surface via a support body 21. A damper 22 is inserted between the support body 21 and the optical system support 5. A damper 22 is inserted between the support body 21 and the base surface plate 23. The damper 22 damps any disturbance from the base surface plate 23 before it reaches the optical system support 5. A first stage and second stage which can move between the alignment measurement area A and the exposure area B are arranged on the stage surface plate 4. The stage surface plate 4 swaps the first and second stages which can move between the alignment measurement area A and the exposure area B, and parallelly executes alignment measurement and exposure in each area. The first stage includes, e.g., a coarse moving stage 13 and a fine moving stage 17 arranged on the coarse moving stage 13. The second stage includes, e.g., a coarse moving stage 12 and a fine moving stage 16 arranged on the coarse moving stage 12.

An alignment scope 6 is a microscope for measuring alignment marks on the substrate and fine moving stage, and performing alignment measurement in the substrate and between the original plate 2 and the substrate.

A stage interferometer 8 is a first interferometer for measuring the position of the coarse moving stage 13 relative to the stage surface plate 4. A stage interferometer 7 is a second interferometer for measuring the position of the coarse moving stage 12 relative to the stage surface plate 4. These stage interferometers 7 and 8 including interferometers which are not shown can perform measurement in directions of a maximum degree of freedom of 6.

An intermediary interferometer 9 is provided around the intermediate position between the alignment measurement area A and the exposure area B to measure the position of each stage relative to the stage surface plate 4. The intermediary interferometer 9 is a third interferometer for passing the position (the measurement result obtained by each interferometer) of one coarse moving to the other coarse moving stage upon swapping. The intermediary interferometer 9 including interferometers which are not shown can perform measurement in directions of a maximum degree of freedom of 6.

A fine movement sensor 14 measures the position of the fine moving stage 16 relative to the coarse moving stage 12. The fine movement sensor 14 includes, e.g., a linear sensor or gap sensor. The fine movement sensor 14 including sensors which are not shown can perform measurement in directions of a maximum degree of freedom of 6. A fine movement sensor 15 measures the position of the fine moving stage 17 relative to the coarse moving stage 13. The fine movement sensor 15 including sensors which are not shown can perform measurement in directions of a maximum degree of freedom of 6.

The fine movement interferometer 10 measures the position of the fine moving stage 16 relative to the optical system support 5. The fine movement interferometer 10 including interferometers which are not shown perform measurement in directions of a maximum degree of freedom of 6. The fine movement interferometer 11 measures the position of the fine moving stage 17 relative to the optical system support 5. The fine movement interferometer 11 including interferometers which are not shown perform measurement in directions of a maximum degree of freedom of 6.

The gap sensors 19 and 20 are fixed on the optical system support 5 and measure the position of the stage surface plate 4 relative to the optical system support 5. In this specification, the position of the stage surface plate 4 relative to the optical system support 5 means the gap (in fact, the gap between the stage surface plate 4 and each surface plate gap sensor fixed on the optical system support 5) between the optical system support 5 and the stage surface plate 4.

The surface plate gap sensors 19 and 20 including sensors which are not shown perform measurement in directions of a maximum degree of freedom of 6. The gap sensor is preferably a capacitance sensor that is more compact and inexpensive than an interferometer.

The coarse moving stage 12 performs exposure alignment for a substrate in the exposure area B (to be described later).

A stage reference mark as a reference target for stage alignment measurement is formed on the upper surface of the stage surface plate 4. An original plate reference mark (not shown) is formed on the original plate 2, while a substrate reference mark (not shown) is formed on a substrate (not shown).

An illuminance sensor (not shown) is arranged on the upper surface of the fine moving stage, and performs calibration measurement for the distance between the original plate reference mark and the substrate reference mark. This measurement result is used for position correction.

A control unit 100 controls each unit of the exposure apparatus.

Figure 2:
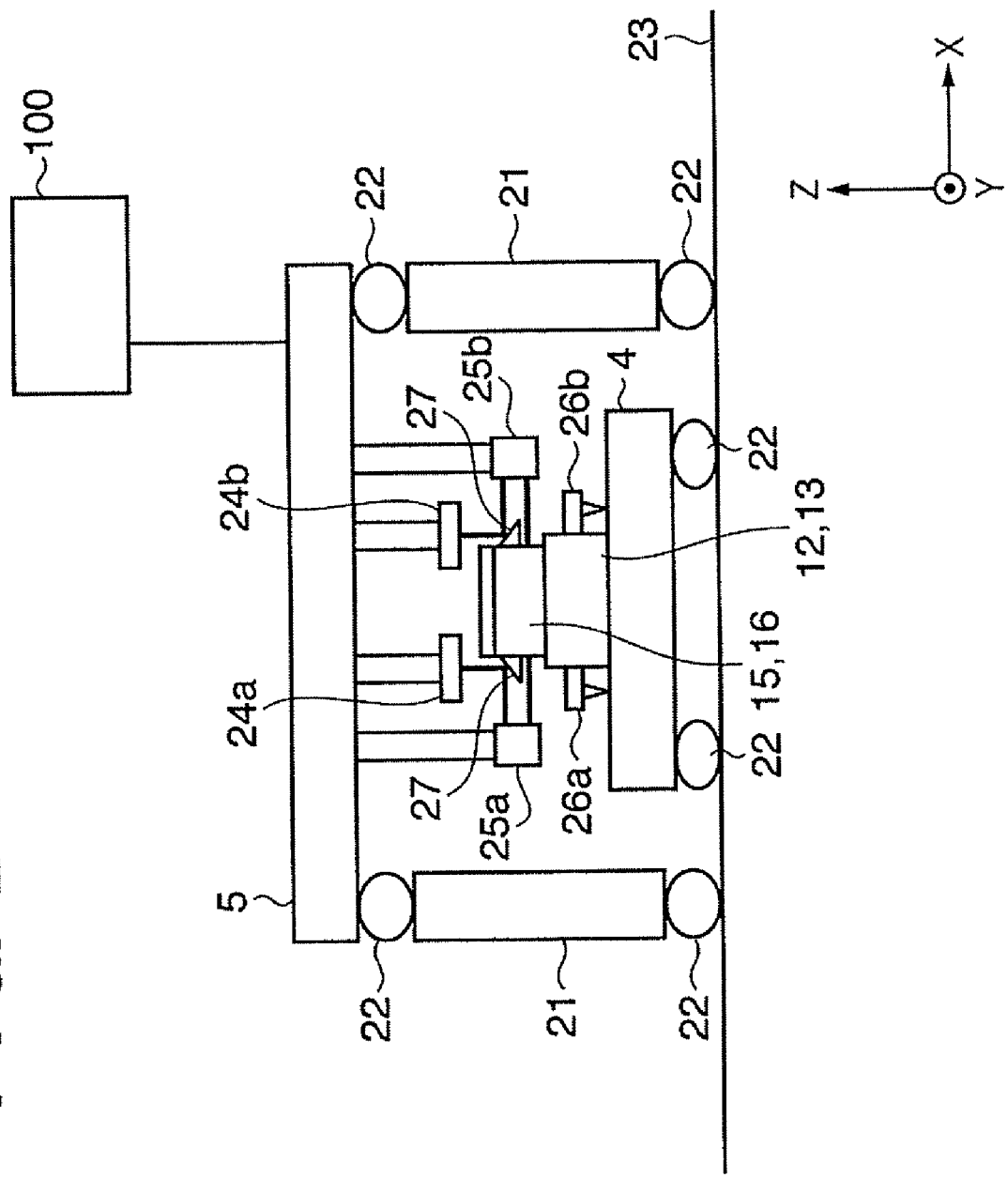
FIG. 2 is a view schematically showing the arrangement of the exposure apparatus shown in FIG. 1 when seen from the Y direction.

FIG. 2 is a view schematically showing the arrangement of the exposure apparatus shown in FIG. 1 when seen from the Y direction. FIG. 2 mainly shows an arrangement for measurement in the Z direction. For the sake of illustrative simplicity, some constituent components are not illustrated in FIG. 2.

z measurement mirrors 24a and 24b are fixed on the optical system support 5 and used to measure the positions of the fine moving stages 16 and 17 relative to the optical system support 5 in the Z direction.

Fine movement Z interferometers 25a and 25b respectively emit two measurement light beams. Each measurement light beam is reflected by a reflecting mirror 27 and the Z measurement mirror 24a or 24b, and returns to the fine movement Z interferometer 25a or 25b. Calculating the difference between the measurement results obtained by these two measurement light beams makes it possible to measure the positions of the fine moving stages 16 and 17 relative to the optical system support 5 in the Z direction.

Coarse movement Z sensors 26a and 26b measure the positions of the coarse moving stages coarse moving stage 12 and 13 relative to the stage surface plate 4 in the Z direction.

Figure 3:
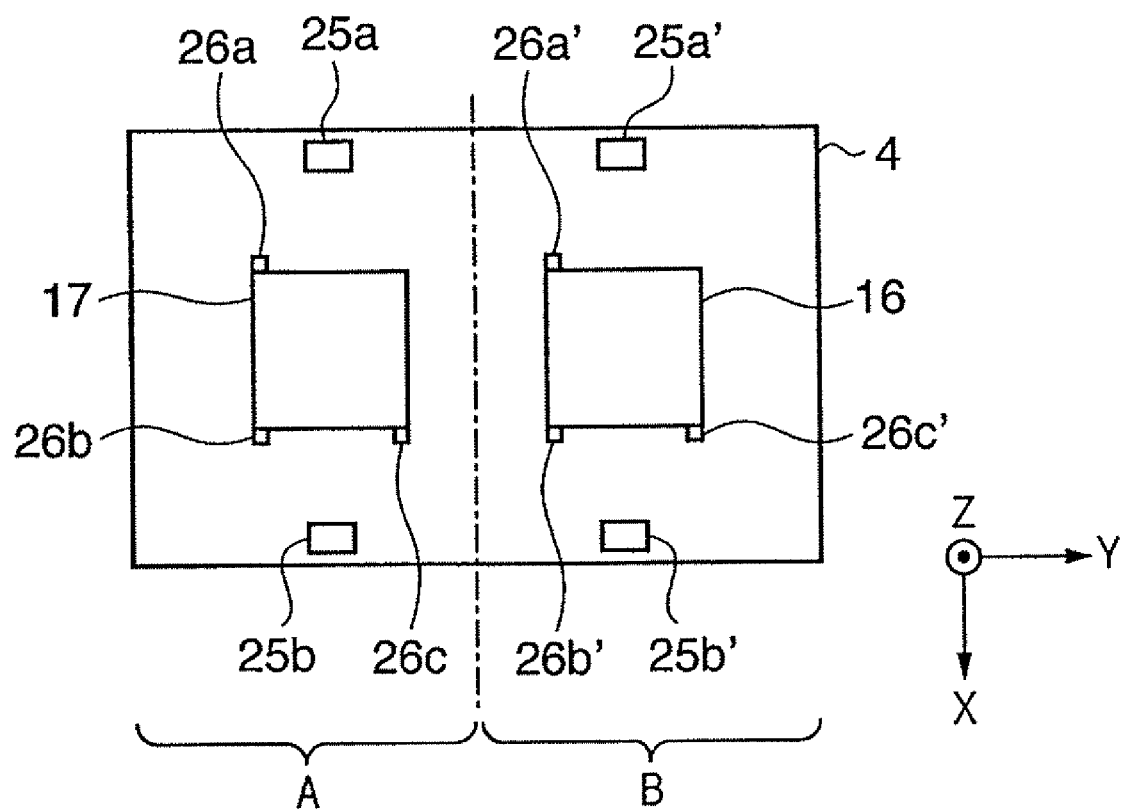
FIG. 3 is a view schematically showing the arrangement of the exposure apparatus shown in FIG. 1 when seen from the Z direction.

FIG. 3 is a view schematically showing the arrangement of the exposure apparatus shown in FIG. 1 when seen from the Z direction. FIG. 3 mainly shows an arrangement for measurement in the Z direction. For the sake of illustrative simplicity, some constituent components are not illustrated in FIG. 3.

Measurement in the alignment measurement area A will be explained first. In the alignment measurement area A, the fine movement Z interferometers 25a and 25b and the coarse movement Z sensors 26a and 26b and a coarse movement Z sensor 26c are arranged. The fine movement Z interferometers 25a and 25b align themselves in a direction perpendicular to the Y direction. The position of the fine moving stage 17 in the ωY direction is calculated on the basis of the measurement results obtained by the fine movement Z interferometers 25a and 25b. The coarse movement Z sensors 26a and 26b align themselves in a direction perpendicular to the Y direction. The position of the coarse moving 13 (see FIG. 1) in the ωY direction is calculated on the basis of the measurement results obtained by the coarse movement Z sensors 26a and 26b. The coarse movement Z sensors 26b and 26c align themselves in a direction perpendicular to the X direction. The position of the coarse moving stage 13 in the ωX direction is calculated based on the measurement results obtained by the coarse movement Z sensors 26b and 26c.

Measurement in the exposure area B will be explained next. In the exposure area B, fine movement Z interferometers 25a' and 25b' and coarse movement Z sensors 26a', 26b, and 26c' are arranged. The fine movement Z interferometers 25a, and 25b, align themselves in a direction perpendicular to the Y direction. The position of the fine moving stage 16 in the ωY direction is calculated on the basis of the measurement results obtained by the fine movement Z interferometers 25a, and 25b'. The coarse movement Z sensors 26a' and 26b, align themselves in a direction perpendicular to the Y direction. The position of the coarse moving stage 12 (see FIG. 1) in the ωY direction is calculated based on the measurement results obtained by the coarse movement Z sensors 26a' and 26b'. The coarse movement Z sensors 26b' and 26c, align themselves in a direction perpendicular to the X direction. The position of the coarse moving stage 12 in the ωX direction is calculated on the basis of the measurement results obtained by the coarse movement Z sensors 26b' and 26c'.

Figure 4:
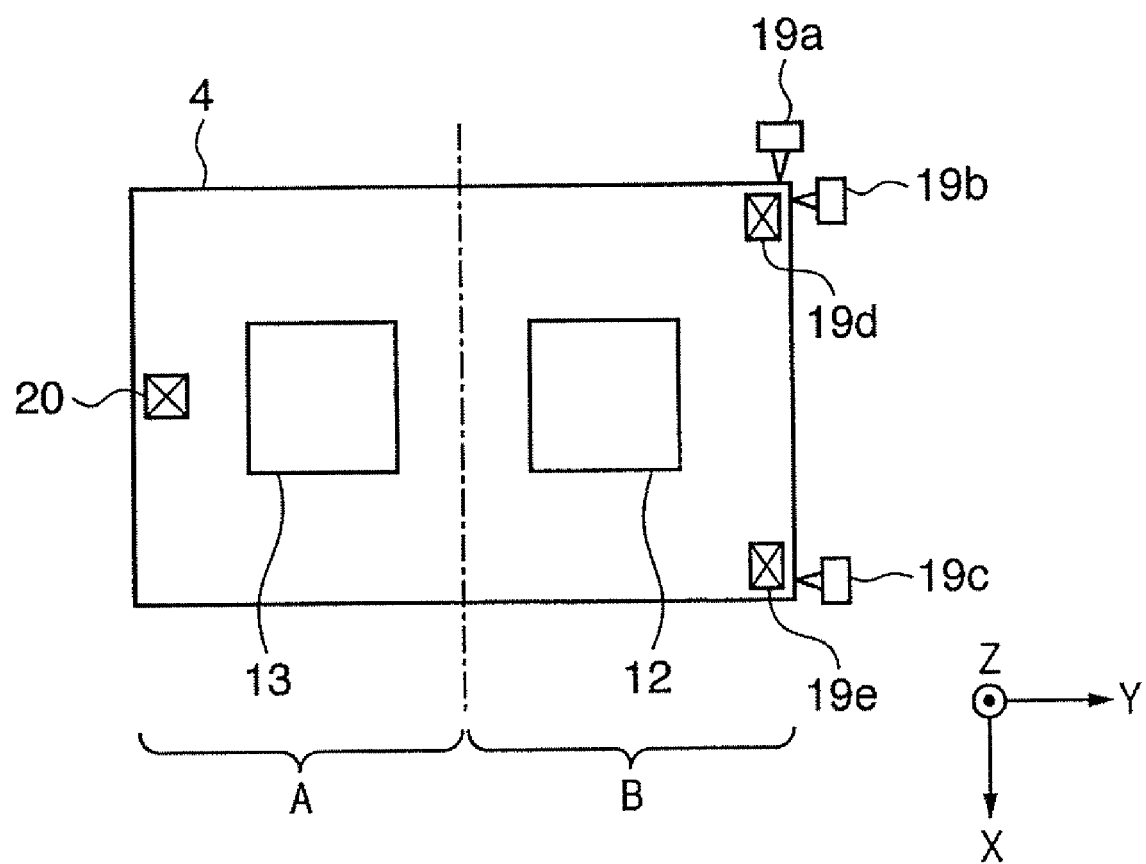
FIG. 4 is a view schematically showing the arrangement of the exposure apparatus shown in FIG. 1 when seen from the Z direction.

FIG. 4 is a view schematically showing the arrangement of the exposure apparatus shown in FIG. 1 when seen from the Z direction. FIG. 4 mainly shows the arrangement of the surface plate gap sensors. For the sake of illustrative simplicity, some constituent components are not illustrated in FIG. 4.

Measurement in the alignment measurement area A will be explained first. In the alignment measurement area A, the surface plate gap sensor 20 is arranged. The surface plate gap sensor 20 measures the gap between the stage surface plate 4 and the optical system support 5 in the Z direction. The position of the stage surface plate 4 in the ωX direction is calculated by combining the measurement result obtained by the surface plate gap sensor 20 with that obtained by at least one of gap sensors 19d and 19e (to be described later).

Measurement in the exposure area B will be explained next. In the exposure area B, gap sensors 19a, 19b, and 19c and the gap sensors 19d and 19e are arranged. The gap sensor 19a measures the gap between the stage surface plate 4 and the optical system support 5 in the X direction. The gap sensors 19b and 19c measure the gap between the stage surface plate 4 and the optical system support 5 in the Y direction. On the basis of the measurement results obtained by the gap sensors 19b and 19c, the position of the stage surface plate 4 in the ωZ direction is calculated. The gap sensors 19d and 19e measure the gap between the stage surface plate 4 and the optical system support 5 in the Z direction. On the basis of the measurement results obtained by the gap sensors 19d and 19e, the position of the stage surface plate 4 in the ωY direction is calculated.

Figure 5:
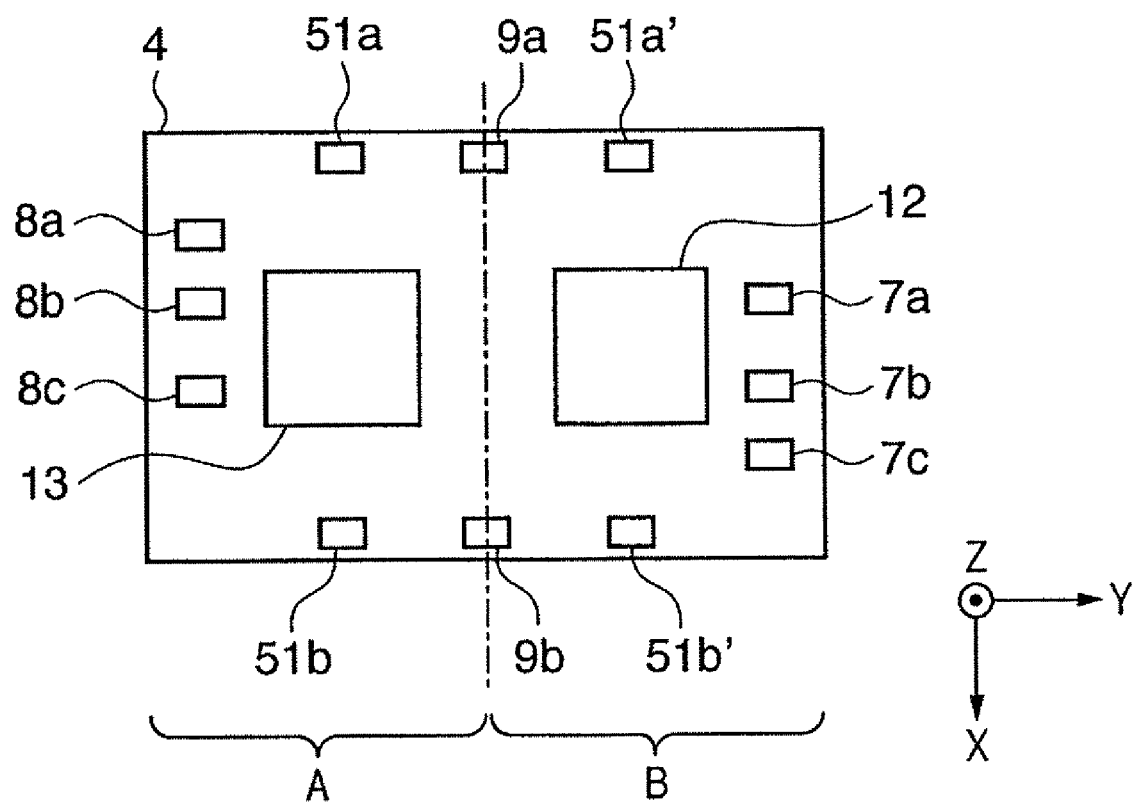
FIG. 5 is a view schematically showing the arrangement of the exposure apparatus shown in FIG. 1 when seen from the Z direction.

FIG. 5 is a view schematically showing the arrangement of the exposure apparatus shown in FIG. 1 when seen from the Z direction. FIG. 5 mainly shows the arrangement of the coarse moving stages for measurement in the X and Y directions. For the sake of illustrative simplicity, some constituent components are not illustrated in FIG. 5.

Measurement in the alignment measurement area A will be explained first. In the alignment measurement area A, an intermediary interferometer 8a and stage interferometers 8b, 8c, 51a, and 51b are arranged. The intermediary interferometer 8a and stage interferometers 8b and 8c measure the position of the coarse moving stage 13 in the Y direction. The coarse moving stage 13 is shifted in the −X direction upon a swap so that the intermediary interferometer 8a and stage interferometer 8b perform measurement. On the basis of the measurement result obtained by the intermediary interferometer 8a or stage interferometer 8c and that obtained by the stage interferometer 8b, the position of the coarse moving stage 13 in the ωZ direction is calculated. The stage interferometers 51a and 51b measure the position of the coarse moving stage 13 in the X direction. When the coarse moving stage 13 is shifted in the −X direction, the stage interferometer 51a performs measurement. When the coarse moving stage 13 is shifted in the +X direction, the stage interferometer 51b performs measurement.

Measurement in the exposure area B will be explained next. In the exposure area B, stage interferometers 7a, 7b, 51a', and 51b, and intermediary interferometer 7c are arranged. The stage interferometers 7a and 7b and intermediary interferometer 7c measure the position of the coarse moving stage 12 in the Y direction. The coarse moving stage 12 is shifted in the +X direction upon a swap so that the stage interferometer 7b and intermediary interferometer 7c perform measurement. On the basis of the measurement result obtained by the stage interferometer 7a or intermediary interferometer 7c and that obtained by the stage interferometer 7b, the position of the coarse moving stage 12 in the ωZ direction is calculated. The stage interferometers 51a' and 51b' measure the position of the coarse moving stage 12 in the X direction. When the coarse moving stage 12 is shifted in the −X direction, the stage interferometer 51a, performs measurement.

When the coarse moving stage 12 is shifted in the +X direction, the stage interferometer 51b' performs measurement.

Intermediary interferometers 9a and 9b are interposed between the alignment measurement area A and the exposure area B. Each of the intermediary interferometers 9a and 9b passes the position of one of the coarse moving stage 12 and coarse moving stage 13 to the other one of the coarse moving stage 12 and coarse moving stage 13 upon swapping.

Figure 6:
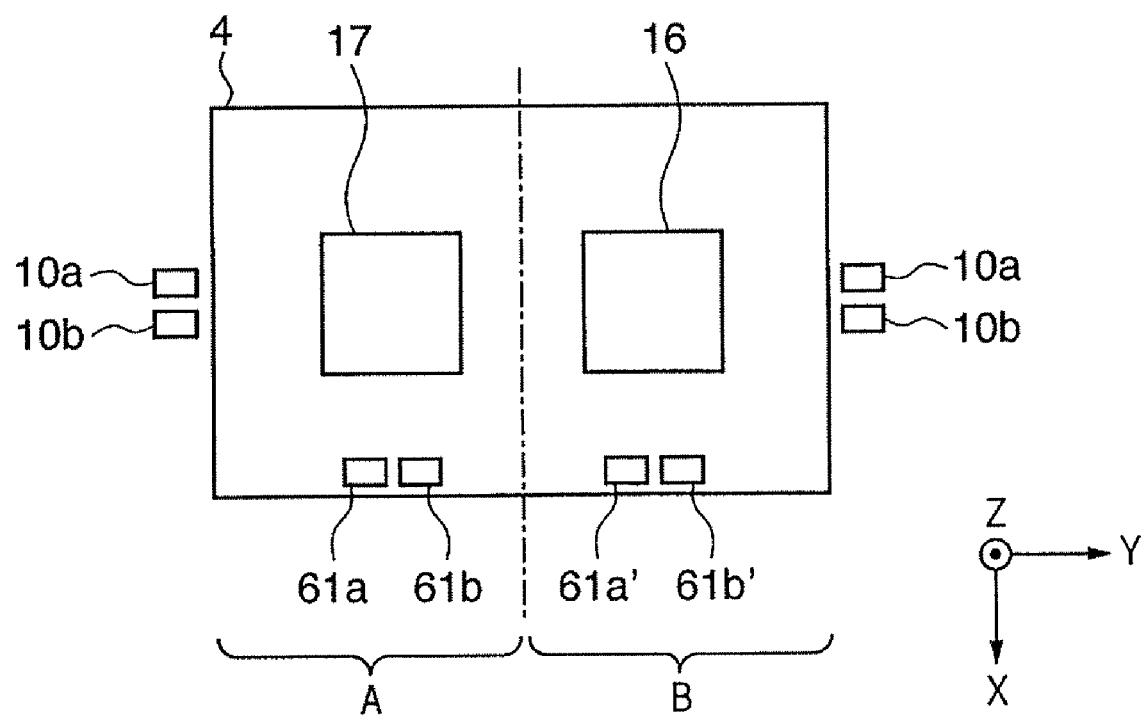
FIG. 6 is a view schematically showing the arrangement of the exposure apparatus shown in FIG. 1 when seen from the Z direction.

FIG. 6 is a view schematically showing the arrangement of the exposure apparatus shown in FIG. 1 when seen from the Z direction. FIG. 6 mainly shows the arrangement of the fine moving stages for measurement in the X and Y directions. For the sake of illustrative simplicity, some constituent components are not illustrated in FIG. 6.

Measurement in the alignment measurement area A will be explained first. In the alignment measurement area A, fine movement interferometers 11a, 11b, 61a, and 61b are arranged. The fine movement interferometers 11a and 11b measure the position of the fine moving stage 17 in the Y direction. On the basis of the measurement results obtained by the fine movement interferometers 11a and 11b, the position of the fine moving stage 17 in the ωX direction is calculated. The fine movement interferometers 61a and 61b measure the position of the fine moving stage 17 in the x direction. On the basis of the measurement results obtained by the fine movement interferometers 61a and 61b, the position of the fine moving stage 17 in the ωZ direction is calculated.

Measurement in the exposure area B will be explained next. In the exposure area B, fine movement interferometers 10a, 10b, 61a', and 61b' are arranged. The fine movement interferometers 10a and 10b measure the position of the fine moving stage 16 in the Y direction. On the basis of the measurement results obtained by the fine movement interferometers 10a and 10b, the position of the fine moving stage 16 in the ωX direction is calculated. The fine movement interferometers 61a' and 61b' measure the position of the fine moving stage 16 in the X direction. On the basis of the measurement results obtained by the fine movement interferometers 61a' and 61b', the position of the fine moving stage 16 in the ωZ direction is calculated.

Figure 7:
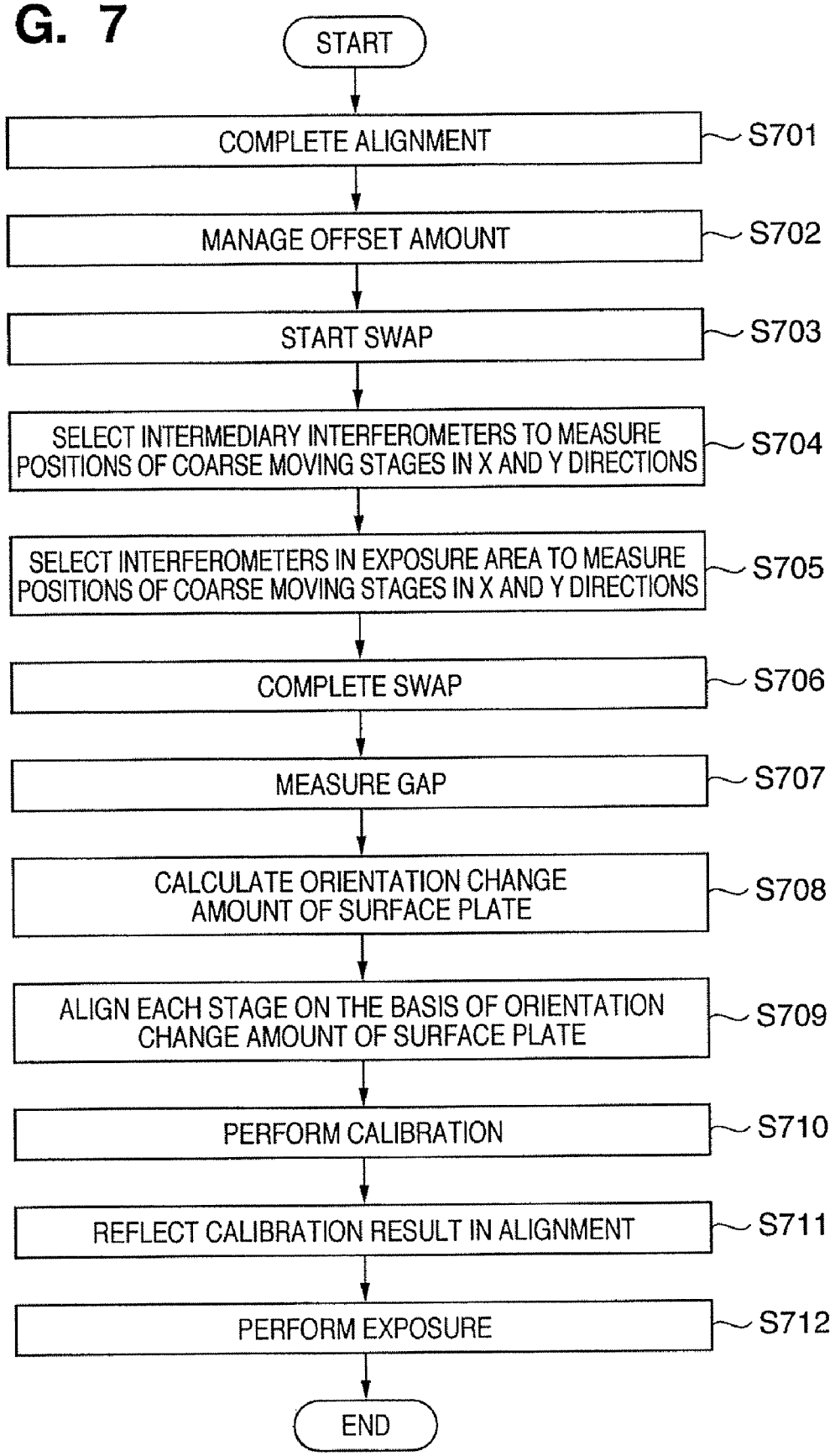
FIG. 7 is a flowchart illustrating a method of passing the position of a fine moving stage relative to a lens barrel support surface plate before and after a swap operation.

FIG. 7 is a flowchart illustrating a method of passing the position of the fine moving stage 16 relative to the optical system support 5 upon the swapping operation. The control unit 100 controls the processing shown in the flowchart of FIG. 7.

In step S701, the coarse moving stage 13 completes alignment measurement.

In step S702, the gap sensors 19 and 20 and the like measure the position of the stage surface plate 4. Stage interferometers (some of which are not shown) including the stage interferometer 8 measure the position of the coarse moving stage 13. Fine movement sensors (some of which are not shown) including the fine movement sensor 15 measure the position of the fine moving stage 17. Combining the position measurement results obtained by these sensors and interferometers indirectly yields the position of the fine moving stage 17 relative to the optical system support 5 before a swap. Fine movement interferometers (some of which are not shown) such as the fine movement interferometer 11 measure the position of the fine moving stage 17. With this operation, the position of the fine moving stage 17 relative to the optical system support 5 before the swap is directly obtained. The difference between the directly and indirectly obtained positions is managed as the offset amount before the swap.

In step S703, the coarse moving stage 13 and coarse moving stage 12 start swapping.

In step S704, the intermediary interferometer 9 is selected to measure the position of the coarse moving stage 13 in the X direction. The position of the coarse moving stage 13 during the swap operation is passed from the stage interferometer 51a to the intermediary interferometer 9a. Likewise, the position of the coarse moving stage 12 during the swap operation is passed from the stage interferometer 51b' to the intermediary interferometer 9b. Also in step S704, the intermediary interferometer 8a is selected to measure the position of the coarse moving stage 13 in the Y direction. The position of the coarse moving stage 13 during the swap operation is passed from the stage interferometer 8b to the intermediary interferometer 8a. Likewise, the position of the coarse moving stage 12 during the swap operation is passed from the stage interferometer 7b to the intermediary interferometer 7a.

In step S705, an interferometer in the exposure area B is selected to measure the position of the coarse moving stage 13 in the X direction. The position of the coarse moving stage 13 after the swap operation is passed from the intermediary interferometer 9a to the stage interferometer 51a'. Likewise, the position of the coarse moving stage 12 after the swap operation is passed from the intermediary interferometer 9b to the stage interferometer 51b. Also in step S705, an interferometer in the exposure area B is selected to measure the coarse moving stage 13 in the Y direction. The position of the coarse moving stage 13 after the swap operation is passed from the intermediary interferometer 8a to the stage interferometer 7a. Likewise, the position of the coarse moving stage 12 after the swap operation is passed from the intermediary interferometer 7c to the stage interferometer 8c.

In step S706, the coarse moving stage 13 and fine moving stage 17 move to the exposure area B, while the coarse moving stage 12 and fine moving stage 16 move to the alignment measurement area A. The swap operation is thus completed.

In step S707, gap sensors (some of which are not shown) such as the gap sensors 19 and 20 measure the position of the stage surface plate 4.

In step S708, on the basis of the measurement result obtained in step S707, the position or displacement (orientation change amount) of the stage surface plate 4 before and after the swap operation is calculated. Fine movement interferometers (some of which are not shown) such as the fine movement interferometer 10 measure the position of the fine moving stage 17. With this operation, the position of the fine moving stage 17 relative to the optical system support 5 after the swap operation is directly obtained. Since the fine movement interferometers do not perform intermediary measurement during a swap, the measurement results before and after the swap have no correlation with each other. Stage interferometers (some of which are not shown) such as the stage interferometer 7 measure the position of the coarse moving stage 13. Fine movement sensors (some of which are not shown) such as the fine movement sensor 15 measure the position of the fine moving stage 17. Combining the position measurement results obtained by these sensors and interferometers indirectly yields the position of the fine moving stage 17 relative to the optical system support 5 after the swap. The intermediary interferometer 9 and the like pass the indirect position measurement system before and after the swap. For this reason, the indirectly obtained positions before and after the swap have a correlation with each other. The offset amount between direct position measurement and indirect position measurement before the swap is combined with the amount of change in indirect measurement result before and after the swap. This makes it possible to correlate the direct position measurement values before and after the swap operation with each other.

As described above, the position of the fine moving stage 17 is measured directly and indirectly before and after a swap. This makes it possible to pass the measurement results obtained by various interferometers to the fine movement interferometer 10.

In step S709, on the basis of the measurement result passed in step S708, the coarse moving stage 13 and fine moving stage 17 which have moved to the exposure area B are aligned.

In step S710, calibration measurement is performed. Since the alignment accuracy of the stage after the swap operation is improved, the calibration time greatly shortens.

In step S711, the calibration result is reflected in the alignment of the coarse moving stage 13 and fine moving stage 17.

In step S712, the substrate arranged on the fine moving stage 17 is exposed.

Application Example

A method of manufacturing a device according to the preferred embodiment of the present invention comprising steps of forming a latent image pattern on a substrate such as a wafer or glass plate using the above exposure apparatus, and developing the latent image pattern formed on the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-112296, filed Apr. 20, 2007, which is hereby incorporated by reference herein in its entirety.

What is claimed is:

1. An exposure apparatus comprising:
   an optical system support configured to support a projection optical system;
   a stage surface plate;
   a first stage and second stage which can move between a first area and second area on said stage surface plate;
   a first interferometer configured to measure stage position relative to said stage surface plate in the first area;
   a second interferometer configured to measure stage position relative to said stage surface plate in the second area;
   a third interferometer which is interposed between said first interferometer and said second interferometer and configured to measure stage position relative to said stage surface plate and to pass the measurement result obtained by one of said first interferometer and said second interferometer to the other one of said first interferometer and said second interferometer;
   a gap sensor configured to measure a gap between said optical system support and said stage surface plate; and
   a control unit configured to pass, when said first stage and said second stage swap by moving between the first area and the second area, the measurement result obtained by one of said first interferometer and said second interferometer to the other one of said first interferometer and said second interferometer using the measurement result obtained by said third interferometer, and to correct the passed measurement result based on the measurement result obtained by said gap sensor.

2. The apparatus according to claim 1, wherein
   each of said first stage and said second stage includes
   a coarse moving stage,
   a fine moving stage arranged on said coarse moving stage, and
   a measurement unit configured to measure a position of said fine moving stage relative to said coarse moving stage,
   each of said first interferometer, said second interferometer, and said third interferometer is configured to measure a position of said coarse moving stage relative to said stage surface plate, and
   said control unit is configured to correct the position of said fine moving stage based on the measurement results obtained by said first interferometer, said second interferometer, said third interferometer, said measurement unit, and said gap sensor.

3. The apparatus according to claim 1, wherein said gap sensor includes a capacitance sensor.

4. A method of controlling an exposure apparatus which comprises an optical system support configured to support a projection optical system, a stage surface plate, a first stage and second stage which can move between a first area and second area on the stage surface plate, a first interferometer configured to measure stage position relative to the stage surface plate in the first area, a second interferometer configured to measure stage position relative to the stage surface plate in the second area, and a third interferometer which is interposed between the first interferometer and the second interferometer and configured to measure stage position relative to the stage surface plate and to pass the measurement result obtained by one of the first interferometer and the second interferometer to the measurement result obtained by the other one of the first interferometer and the second interferometer, comprising steps of:
   measuring a gap between the optical system support and the stage surface plate;
   passing, when the first stage and the second stage swap by moving between the first area and the second area, the measurement result obtained by one of the first interferometer and the second interferometer to the measurement result obtained by the other one of the first interferometer and the second interferometer using the measurement result obtained by the third interferometer; and
   correcting the passed measurement result on the basis of the gap.

5. A method of manufacturing a device, the method comprising steps of:
   forming a latent image pattern on a substrate using an exposure apparatus defined in claim 1; and
   developing the latent image pattern formed on the substrate.

* * * * *